US012768029B2

(12) United States Patent
Kimoto et al.

(10) Patent No.: US 12,768,029 B2
(45) Date of Patent: Oct. 20, 2026

(54) EVAPORATION SOURCE FOR VACUUM EVAPORATION APPARATUS

(71) Applicant: ULVAC, INC., Kanagawa (JP)

(72) Inventors: Takahito Kimoto, Kanagawa (JP); Masashi Yasuda, Kanagawa (JP); Toshiharu Kurauchi, Kanagawa (JP); Shunsuke Sasaki, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 419 days.

(21) Appl. No.: 18/537,130

(22) Filed: Dec. 12, 2023

(65) Prior Publication Data

US 2024/0279790 A1 Aug. 22, 2024

(30) Foreign Application Priority Data

Feb. 21, 2023 (JP) ................................ 2023-024929
Jun. 12, 2023 (JP) ................................ 2023-096544

(51) Int. Cl.
*C23C 14/24* (2006.01)

(52) U.S. Cl.
CPC .................................. *C23C 14/243* (2013.01)

(58) Field of Classification Search
None
See application file for complete search history.

(56) References Cited

U.S. PATENT DOCUMENTS

| | | | | |
|---|---|---|---|---|
| 3,617,348 A * | 11/1971 | Kelley | C23C 14/16 | 118/725 |
| 3,667,424 A * | 6/1972 | Cornelius | C23C 14/56 | 118/727 |
| 5,099,791 A * | 3/1992 | Tsukazaki | H05H 3/00 | 118/723 CB |
| 8,608,855 B2 * | 12/2013 | Ohsawa | C23C 16/448 | 118/727 |
| 2024/0279790 A1 * | 8/2024 | Kimoto | C23C 14/26 | |

FOREIGN PATENT DOCUMENTS

| | | | |
|---|---|---|---|
| CN | 114164401 A * | 3/2022 | C23C 14/35 |
| JP | 2006299372 A * | 11/2006 | |
| JP | 2007-46106 A | 2/2007 | |
| JP | 4281029 B2 * | 6/2009 | |

* cited by examiner

*Primary Examiner* — Sylvia MacArthur
(74) *Attorney, Agent, or Firm* — Future IP LLC; Tomoko Nakajima

(57) ABSTRACT

Provided is an evaporation source for use in a vacuum evaporation apparatus, the evaporation source restricting a local overheating and planning prolonged lifetime. The evaporation source includes: a boat main body having a containing part for the evaporation material; rising plate parts each rising upward from both ends as seen in one direction of the boat main body; and electrode mounting plate parts each extending outward from the respective upper ends of the rising plate parts. The boat main body is heated by applying electric power across both the electrode mounting plate parts, thereby causing the evaporation material inside the containing part to be evaporated. At this time, the rising plate parts are provided with dividing passages for the applied electric current.

10 Claims, 5 Drawing Sheets

EVAPORATION SOURCE FOR VACUUM EVAPORATION APPARATUS

This application claims priority under 35 U.S.C. § 119 to Japanese Patent Application No. 2023-024929, filed Feb. 21, 2023, and Japanese Patent Application No. 2023-096544, filed Jun. 12, 2023, which are incorporated by reference.

TECHNICAL FIELD

The present invention relates to an evaporation source for use in a vacuum evaporation apparatus, the evaporation source being for depositing an evaporation material on a to-be-deposited article by evaporating the evaporation material in a vacuum chamber.

BACKGROUND ART

Among these kinds of evaporation sources for use in a vacuum evaporation apparatus, there is known, e.g., in patent document 1 an example in which an evaporation boat is employed. The evaporation source in question comprises: a boat main body having a containing part for containing therein an evaporation material; rising plate parts each rising upward from respective ends as seen in one direction of the boat main body; and electrode mounting plate parts each extending from an upper end of the respective rising plate parts outward. In order to attain reduced costs, etc., ordinarily, each part such as the boat main body, the rising plate part, and the electrode mounting plate part is formed by a plate material made of metal. Then, the evaporation boat is placed in position inside the vacuum chamber by respectively holding (pinching) it by a pair of the upper and the lower electrode plates. At the time of depositing the evaporation material on an article to be processed (elsewhere also called "a to-be-processed article") inside the vacuum chamber, the evaporation boat main body is heated by Joule heat by applying power by electric source through electrode plates to both the electrode mounting plate parts. For example, by constantly or intermittently feeding a wire-shaped evaporation material, e.g., from an upper side of the boat main body to the containing part of the boat main body, thereby melting and evaporating the evaporation material inside the containing part. As a result of splashing of this evaporated evaporation material, it is deposited on the to-be-processed article. At this time, the evaporated material is fluidized in the containing part and this fluidized material is prevented by the rising plate parts from crawling up (rising) to the electrode mounting plate parts.

By the way, if the above-mentioned evaporation boat is heated in a state in which there is no evaporation material inside the containing part, the boat main body, the rising plate parts and the electrode mounting plate parts are subjected to heating to an equivalent temperature. However, it has been found that, when the wire-shaped evaporation material is fed to the containing part of the heated boat main body, there are cases where the rising plate parts get overheated to a high temperature. Should the state in which the rising plate parts get overheated be continued in this manner, there will result in deformation of each part of the evaporation boat. On occasions, there will occur disadvantages in that the plate thickness is reduced (thinner-plate thickness), resulting in the occurrence of holes. There is thus a problem in that the evaporation boat will become shorter in its lifetime. This is considered to be attributable to the following causes. Namely, when the wire-shaped evaporation material is fed to, and melted in, the containing part of the boat main body, depending on the kind of the evaporation materials, the electric resistance value of the boat main body will be reduced (in other words, the energized current will be divided into the molten evaporation material), so that the electric resistance value at the rising plate parts becomes relatively high.

PRIOR ART DOCUMENTS

Patent Documents

Patent Document 1: JP-2007-46106-A

SUMMARY OF THE INVENTION

Problems that the Invention is to Solve

This invention has been made in view of the above-mentioned points and has a problem of providing an evaporation source for use in a vacuum evaporation apparatus, in which the evaporation source prevents excessive local overheating in order to attain a longer lifetime.

Means for Solving the Problems

In order to solve the above-mentioned problem, an evaporation source for use in a vacuum evaporation apparatus according to this invention is to deposit an evaporation material on a to-be-deposited article by evaporating the evaporation material in a vacuum chamber. The evaporation source comprises an evaporation boat including: a boat main body having a containing part for the evaporation material; rising plate parts each rising upward from respective ends as seen in one direction of the boat main body; and electrode mounting plate parts each extending from an upper end of the respective rising plate parts outward. The boat main body is heated by applying electric power across both the electrode mounting plate parts, thereby causing the evaporation material inside the containing part to be evaporated. In the above-mentioned arrangement, the rising plate parts are provided with dividing passages for the applied electric current.

According to this invention, when the evaporation material is melted in the containing part of the boat main body under heated conditions, even if the electric resistance value of the boat main body has been decreased, the electric resistance value of the rising plate parts can be prevented, by the dividing passages, from relatively getting higher. As a result, the overheating of the rising plate parts can be prevented to the best extent possible, thereby prolonging the lifetime of the evaporation boat. In this case, it is preferable to set the dividing passages such that the electric resistance value at the rising plate parts becomes equivalent to the electric resistance value at the boat main body during evaporation. According to this arrangement, the boat main body and the rising plate parts can be made equivalent in temperature during evaporation. As a consequence, even if the evaporation material that has been melted inside the containing part may try to crawl up to the rising plate parts, this crawled-up evaporation material may also be evaporated quickly. In this manner, the evaporation material can be prevented from getting deposited at the rising plate part and, in addition, the fluctuation in the deposition rate can also be prevented. It is to be noted that, once the rising plate parts are overheated, bumping may take place at the time of contact of the molten evaporation material's crawling up into contact with the rising plate parts. However, since the overheating of the rising plate parts is prevented from taking place, the occurrence of bumping can also be prevented to the best extent possible.

In this invention the dividing passages can be constituted by a pair of reinforcing plates which are arranged to pinch the electrode mounting plate parts and the rising plate parts from both sides thereof as seen in the plate thickness direction of both the plate parts. As a result, without impairing the function of preventing the relative increase in the electric resistance value of the rising plate parts, the electrode mounting plate parts and the rising plate parts can be reinforced, thereby advantageously further preventing the deformation of the evaporation boat. In this case, the reinforcing plates shall preferably be constituted by a high-melting point metallic material selected from the group consisting of molybdenum, tungsten, and tantalum.

Further, in this invention, in case the evaporation source comprises a pair of upper and lower electrode plates for pinching therebetween the electrode mounting plate parts, there may be employed an arrangement in which screen parts are disposed each on the reinforcing plate that is positioned on the upper side so as to cover an end face, lying on the side of the boat main body, of the electrode plate. According to this arrangement, even if the molten evaporation material may crawl up to the electrode mounting plate parts through the rising plate parts for some reasons or other, the molten evaporation material can be blocked by the screen parts, thereby surely preventing the molten evaporation material from directly reaching the electrode plates.

MODES FOR CARRYING OUT THE INVENTION

With reference to the drawings, description will be made of an embodiment of an evaporation source BS for use in a vacuum evaporation apparatus of this invention based on an example in which a copper film is evaporated on a deposition surface of a substrate Sg in a vacuum chamber while feeding an evaporation material Em to thereby evaporate it, on condition: that an article (hereinafter called "a substrate Sg") to receive thereon evaporated particles is a square glass substrate; that an evaporation material Em is made of copper formed into a wire shape; and that, while feeding the evaporation material Em and allow it to be evaporated, a copper film is vapor-deposited on a film-forming surface of the substrate Sg inside a vacuum chamber. In the following descriptions the terms showing the direction such as up (or upper), down (or lower) shall be based on FIG. 1 which shows an installed posture of the evaporation source BS.

Figure 1:
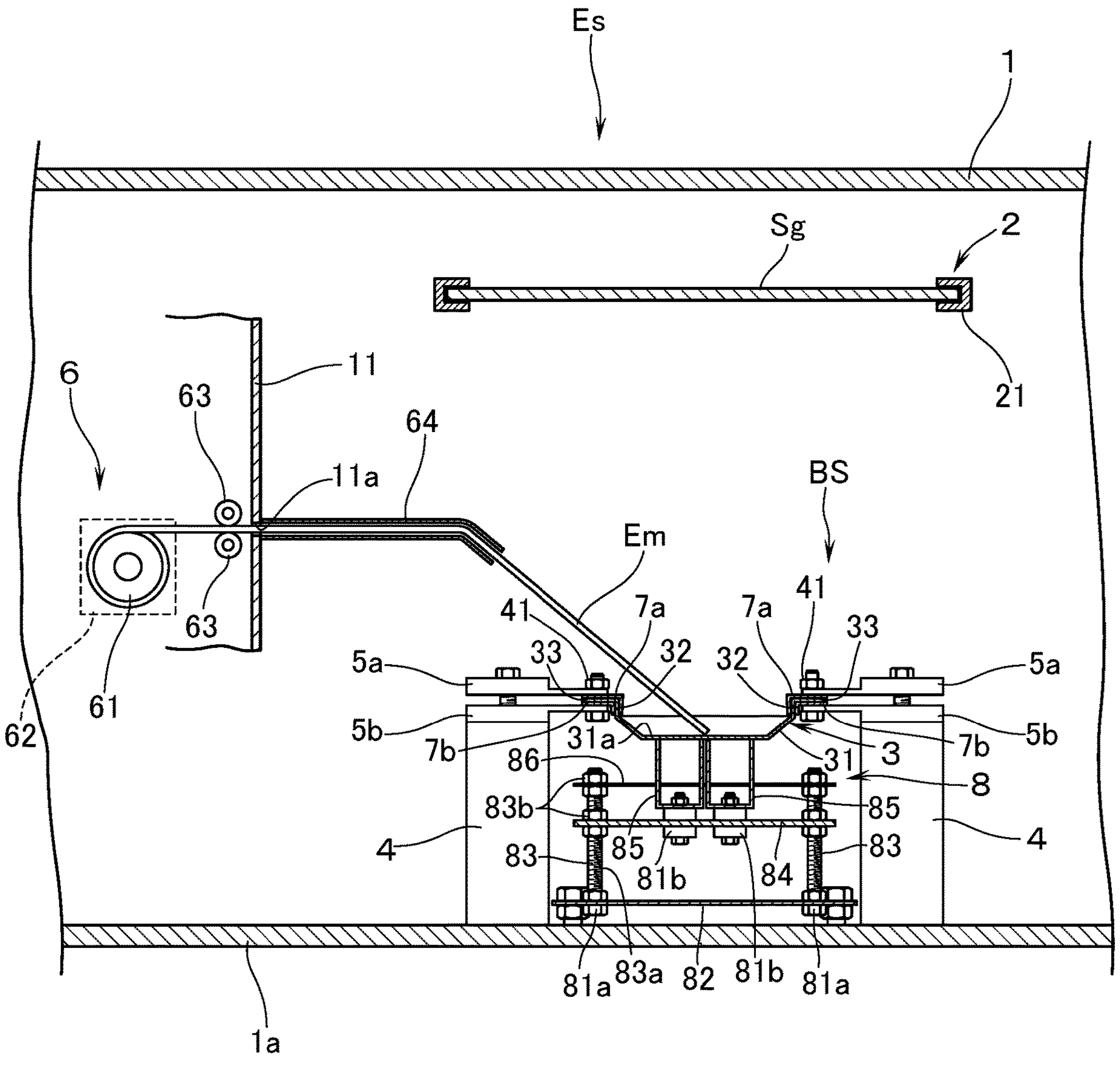
FIG. 1 is a sectional view showing an arrangement of an inline-type of vacuum evaporation apparatus equipped with an evaporation source according to this embodiment.

With reference to FIG. 1, an in-line type of vacuum evaporation apparatus Es is provided with a vacuum chamber 1. The vacuum chamber 1 has connected thereto a vacuum pump through an exhaust pipe (not illustrated) so that the inside of the vacuum chamber can be evacuated to a predetermined pressure (vacuum degree), thereby forming a vacuum atmosphere. In an upper space of the vacuum chamber 1, there is provided a substrate transport apparatus 2. The substrate transport apparatus 2 has a carrier 21 for holding the substrate Sg in a state in which the lower surface, serving as a surface on which a film is to be deposited, of the substrate is left open. By means of a driving apparatus (not illustrated) the carrier 21 and consequently the substrate Sg can be transported at a predetermined speed in one direction inside the vacuum chamber 1. Since a known apparatus can be used as the substrate transport apparatus 2, further description thereof will be omitted. In a manner to lie opposite to the substrate Sg that is to be transported in one direction, the evaporation source BS according to this embodiment is disposed in a space inside the vacuum chamber 1.

Figure 2A:
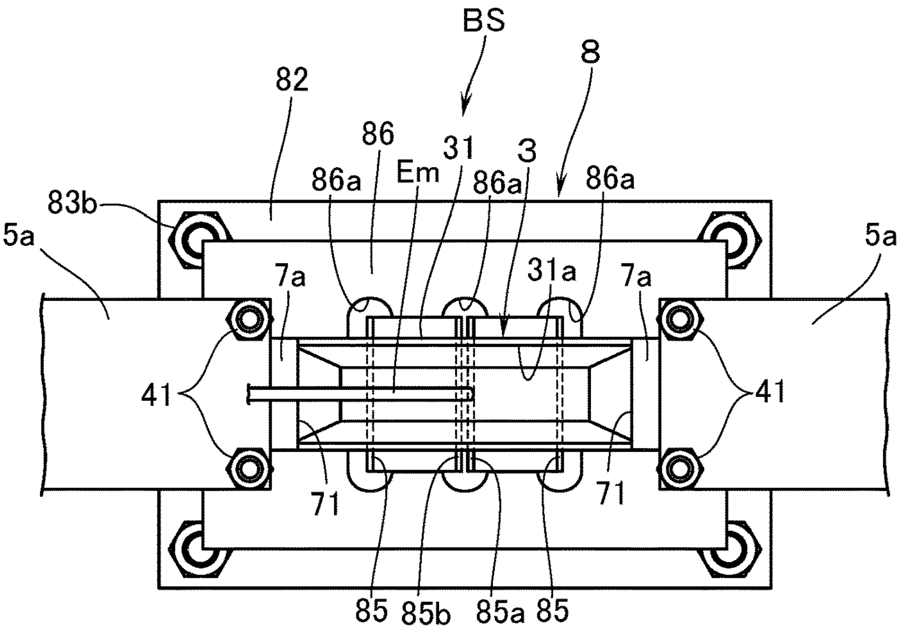
FIG. 2(*a*) is an enlarged plan view of the evaporation source shown in FIG. 1 and FIG. 2(*b*) is an enlarged sectional view of the evaporation source.
Figure 2B:
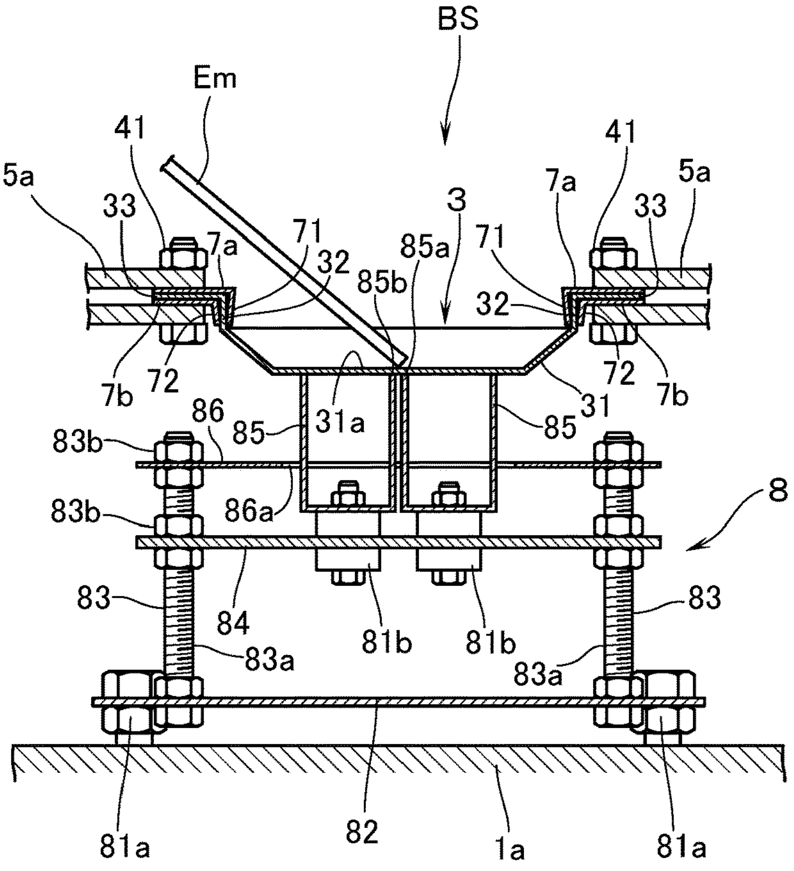

With reference also to FIG. 2, the evaporation source BS is provided with an evaporation boat 3. The evaporation boat 3 is provided with: a boat main body 31 having a recessed part 31*a*, as a containing part with a flat bottom surface, for containing therein the evaporation material Em; rising plate parts 32 each rising upward substantially at right angles on both longitudinal (left and right direction in FIG. 1) ends of the boat main body 31; and electrode mounting plate parts 33 each extending horizontally outward from respective upper ends of both the rising plate parts 32. In this embodiment, the evaporation boat 3 is made of a metallic plate material having a higher-melting point than does the evaporation material Em and, specifically, is formed by integrally press-working a plate having a constant thickness within a range of 0.3 mm through 3 mm. As the "higher-melting point metal" referred to in this invention, there can be listed molybdenum, tungsten and tantalum. Among them is included a metal having the main ingredients of either one kind of molybdenum, tungsten and tantalum (e.g., molybdenum having added thereto yttrium oxide in a predetermined weight percentage).

On the inner surface of the lower wall 1*a* of the vacuum chamber, there are installed two supporting platforms 4, 4 which are constituted by an insulating material at a distance from each other as seen in the longitudinal direction. On an upper surface of the supporting platforms 4, 4 there are installed a pair of upper and lower electrode plates 5*a*, 5*b* made of a metal of good conductivity such as copper in such a manner that each of the electrode mounting plate parts 33 of the evaporation boat 3 is detachably mounted by pinching them in a vertical direction by means of a fastening means 41 such as bolts and the like. In this case, such parts of the electrode plates 5*a*, 5*b* as will pinch the electrode mounting plate parts 33 have a far wider width than does the electrode plates 5*a*, 5*b* so that the electrode mounting plate parts 33 can be kept in close contact with each other over the entire surface thereof. The electrode mounting plate parts 33 can thus be fastened by the fastening means 41 on both sides of the electrode mounting plate parts 33. In a state of having mounted the electrode plates 5*a*, 5*b* while pinching the electrode mounting plate parts 33, the evaporation boat 3 is installed at a predetermined height position from the inner surface of the lower wall 1*a* of the vacuum chamber in a posture in which the bottom plate of the boat main body 31, defining the recessed part 31*a*, becomes horizontal.

Inside the vacuum chamber 1 there is provided a material feeding means 6 for continuously or intermittently feeding the wire-shaped evaporation material Em into the recessed part 31*a* of the boat main body 31. The material feeding means 6 is provided with: a feed roller 61 which is installed on a side opposite to the evaporation source BS relative to a deposition preventing plate 11 disposed inside the vacuum chamber 1; an electric motor 62 for driving, by rotation, the feed roller 61; and a pair of upper and lower guide rollers 63, 63. The deposition preventing plate 11 has formed therein a through hole 11*a* which is positioned above the evaporation boat 3 and which is for inserting therethrough the evaporation material Em. On such a side of the deposition preventing plate 11 as lies on the side of the evaporation source BS, there is installed a guide pipe 64 of a predetermined length bent into an articulated manner. As the evaporation material Em there is used one formed into an outside diameter of 1 mm through 5 mm, which is wound around the feed roller 61 in advance. Then, the front end of the wire-shaped evaporation material Em that is wound around the feed roller 61 is pulled out so as to pass it through the pair of upper and lower guide rollers 63, 63, thereby allowing it to pass from the through hole 11*a* to the inside of the guide pipe 64. The front end of the evaporation material Em to be protruded out of the guide pipe 64 is arranged to come into contact with the inner bottom surface in the longitudinally central region of the recessed part 31*a*. The wire-shaped evaporation material Em is prepared in this manner.

In case a copper film is deposited on a lower surface of the substrate Sg inside the vacuum chamber 1 under vacuum atmosphere, the boat main body 31 is heated by Joule heat by applying electric current from a power source (not illustrated) across both the electrode mounting plate parts 33, 33 through the electrode plates 5*a*, 5*b*. After a lapse of a predetermined time, the feed roller 61 is driven for rotation by the electric motor 62 so as to feed the wire-shaped evaporation material Em. According to these operations, the evaporation material Em that is present inside the recessed part 31*a* is melted and evaporated. As a result of splashing of the evaporated material, a copper film is deposited on the lower surface of the substrate Sg that is moving in one direction. At this time, the melted evaporation material Em will be fluidized in the recessed part 31*a*, and this fluidized evaporation material is prevented by the rising plate parts 32 from crawling up toward the electrode mounting plate parts 33, 33. The current value to be applied across both the electrode mounting plate parts 33, 33 and the feeding speed of the wire-shaped evaporation material Em are appropriately set depending on the rate of deposition on the substrate Sg.

When the wire-shaped evaporation material Em is fed to the recessed part 31*a* of the heated boat main body 31, there will be a case in which the rising plate parts 32 will sometimes be heated to an elevated temperature. This is considered to be due to the fact that the electric resistance value of the boat main body 31 is reduced (in other words, the applied electric current is divided into the molten evaporation material Em), and that the electric resistance value of the rising plate parts 32 becomes relatively high. If the state in which the rising plate parts 32 are overheated continues, each part of the evaporation boat 3 will result in thermal deformation and, in some cases, the plate thickness is reduced (thin-walling), thereby resulting in a disadvantage of making (springing) holes. As a result, the evaporation boat 3 ends in an early lifetime.

Figure 3:
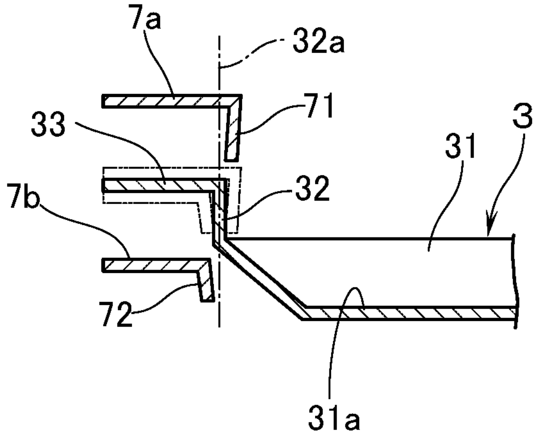
FIG. 3 is a partial enlarged view to explain the mounting of reinforcing plates on rising plate parts.

In this embodiment, in order for the rising plate parts 32 and the electrode mounting plate parts 33 to coincide with each other in outline, the following arrangements have been made. Namely, there are prepared two pieces of reinforcing plates 7*a*, 7*b*, each being formed by fabricating a single plate material having a constant plate thickness into an L-shape. When they are attached to the electrode plates 5*a*, 5*b*, the electrode mounting plate parts 33 and the rising plate parts 32 are arranged to be pinched by a pair of the reinforcing plates 7*a*, 7*b* from both sides as seen in the plate thickness direction (vertical direction). As the reinforcing plates 7*a*, 7*b*, there may be used one made of a metal of high-melting point. Further, as shown in FIG. 3, relative to the rising plate parts 32 and the electrode mounting plate part 33, such downwardly bent part 71 of one 7*a* of the reinforcing plates as is mounted from above is inclined toward the rising plate parts 32 relative to an extension line 32*a*, that passes through the rising plate parts 32, within a range of predetermined angle (e.g., 2 degrees through 10 degrees). Further, a downwardly bent part 72 of the other 7*b* of the reinforcing plates is inclined, relative to the extension line 32*a*, toward the rising plate parts 32 within a range of predetermined angle (e.g., 2 degrees through 10 degrees). According to this arrangement, without the need of using a particular fixing means such as bolts and the like for integrating and pinching the reinforcing plates 7*a*, 7*b* to the rising plate parts 32 and the electrode mounting plate parts 33, the rising plate parts 32 can be surely pinched by a pair of the reinforcing plates 7*a*, 7*b* from both sides of the plate thickness direction.

According to the above-mentioned arrangement, when the wire-shaped evaporation material Em is fed into, and melted in, the recessed part 31*a* of the boat main body 31 under heated conditions, even if the electric resistance value of the boat main body 31 may be decreased, the pair of reinforcing plates 7*a*, 7*b* serve the purpose of dividing passages for the applied electric current. The electric resistance value of the rising plate parts 32 can thus be prevented from relatively rising, so that the overheating of the rising plate parts 32 can be prevented to the best extent possible. Further, since the electrode mounting plate parts 33 and the rising plate parts 32 are reinforced by a pair of reinforcing plates 7*a*, 7*b*, the evaporation boat 3 can still further be prevented from deformation. As a result, the evaporation boat 3 can be prevented from getting locally overheated or deformed, thereby attempting to extend the lifetime of the evaporation boat 3. In this case, in order for the electric resistance value at the rising plate parts 32 to be equivalent to the electric resistance value of the boat main body 31 during deposition, the sectional area of each of the reinforcing plates 7*a*, 7*b* shall preferably be set accordingly. According to this arrangement, during deposition, the boat main body 31 and the rising plate parts 32 can be made equivalent to each other in temperature. As a result, even if the molten evaporation material Em, melted inside the recessed part 31*a* during evaporation, were to crawl up to the rising plate parts 32, the crawled up evaporation material Em will also be quickly evaporated. Consequently, the evaporation material Em can be prevented from getting accumulated at the rising plate parts 32 and, in addition, the change in the deposition rate can also be prevented. By the way, once the rising plate parts 32 get overheated, bumping may occur when the molten evaporation material Em crawls up into contact with the rising plate parts 32. But since the overheating of the rising plate parts 32 is prevented, the occurrence of the bumping can also be prevented.

Figure 4:
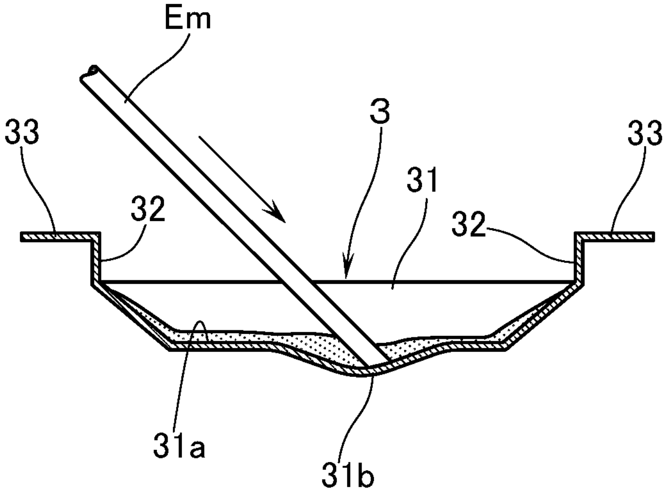
FIG. 4 is a figure to explain a creep deformation that occurs to the boat main body.

By the way, as noted above, when the wire-shaped evaporation material Em is fed to the recessed part 31*a* of the heated boat main body 31, depending on the heating temperature of the boat main body 31 and the feeding speed of the evaporation material Em, depending on the evaporation rate, the following will occur. Namely, as shown in FIG. 4, the bottom part 31*b* of the boat main body 31, which defines the recessed part 31*a* and to which the load to be brought about by the feeding of the evaporation material Em functions, will be deformed in such a manner that the bottom plate part 31*b* of the boat main body 31 will be swollen downward. As noted, the deformation which occurs to the bottom plate part 31*b* is due to creep under high temperature (creep deformation). If the amount of deformation at this time becomes larger with an increase in the evaporation time, the bottom plate part 31*b* of the boat main body 31 will sooner or later make a hole. In addition, with the increase in the evaporation time, the deformation of the entire evaporation boat 3 progresses from the electrode mounting plate parts 33 to the boat main body 31. Depending on cases, the rising plate parts 32 may be ruptured and, in this case too, the evaporation boat 3 will end its lifetime earlier.

In this embodiment, supporting means 8 is disposed in a manner to contact the bottom plate part 31*b* from the lower side thereof. The supporting means 8 is provided with a first base plate 82 which is installed horizontally by interposing first insulators 81*a* on the inside of the lower wall 1*a* of the vacuum chamber, the supporting means being positioned on the inner side of both the supporting stands 4, 4. The first base plate 82 has vertically installed two supporting columns 83, 83 which extend upward. Then, at a predetermined height position from the inner wall of the vacuum chamber 1*a*, there is provided a second base plate 84, by being supported by each of the supporting columns 83. The second base plate 84 is provided with supporting plates 85 whose upper ends come into contact with the lower surface of the boat main body 31 by interposing second insulators 81*b*. The supporting plates 85 have a larger width (in the vertical direction as seen in FIG. 2(*a*)) than does the boat main body 31, and is formed by bending, into a shape of "⊏" (trough), a piece of high-melting point metal having a constant plate thickness of 0.1 mm through 2 mm. In this embodiment, two pieces of the above-mentioned bent supporting plates 85 are installed in parallel with each other in the following postures, i.e.: in a posture in which two pieces of the bent supporting plates 85 are arranged so that both the free ends 85*a*, 85*b* face the recessed part 31*a* side; in a posture in which one of the free ends, that are adjacent to each other, of each of the supporting plates 85, 85 faces the recessed part 31*a* side; and also in a posture in which the width-direction of each of the supporting plates 85, 85 coincides with the direction orthogonal to the longitudinal direction of the boat main body 31. In this case, the clearance in the longitudinal direction between the free ends 85*a*, 85*b* is appropriately set depending on the deformation range of the bottom plate part 31*b*.

By being supported by each of the supporting columns 83, a reflector plate 86 having an area equivalent to the bottom surface of the evaporation boat 3 is disposed. The reflector plate 86 is constituted by a high-melting point metallic plate material having a plate thickness in a range of 0.1 mm through 2 mm. In this case, such a surface of the reflector plate 86 as lies opposite to the boat main body 31 may be subjected to mirror finish. Further, the reflector plate 86 has formed therein a slit 86*a* so as to enable the supporting plates 85, 85 to be inserted therethrough. In this embodiment, the supporting columns 83, 83 are provided on their external surfaces with screw threads 83*a* so that a plurality of nut members 83*b* are in threaded engagement with the screw threads 83*a*. In this case, the second base plate 84 and the reflector plate 86 have formed through holes (not illustrated) which penetrate in the plate thickness direction. The supporting columns 83, 83 are inserted into the through holes for positioning thereof by means of the nut members 83*b* which form a pair in the vertical direction. It is thus so arranged that the height position of the second base plate 84 and reflector plate 86 relative to the boat main body 31 can be appropriately fine-adjusted.

According to the above-mentioned arrangement, by providing the bottom plate part 31*b* of the boat main body 31 with supporting means 8 so as to come into contact from the lower side, with which load to be caused by the feeding of the evaporating material Em operates, the creep deformation can be prevented to the best extent possible. At this time, by constituting the supporting means 8 as defined above, the area of contact with the bottom plate part 31*b* can be made small to the best extent possible. In addition, even if the region on which the load is operated on the bottom plate part 31*b* by the vibrations, etc. at the time of feeding the wire-shaped evaporation material Em, may vary to some degrees, the free ends 85*a*, 85*b* of the supporting plates 85 can be managed to be positioned, and thus the bottom plate part 31*b* on which the load operates can be constantly supported. In addition, since the two pieces of flexed (or bent) supporting plates 85, 85 are arranged in parallel with each other, the other free end of each of the supporting plates 85, 85 will support the longitudinal both ends (parts other than the bottom plate part 31*b*). Therefore, the deformation of the entire boat main body 31 can be reduced and, during evaporation work, the boat main body 31 can be held substantially horizontal all the time.

Further, since the reflector plate 86 is further provided, in case bumping should occur inside the recessed part 31*a* of the boat main body 31 due to some causes or other during evaporation, there can be surely prevented such an occurrence as an electric insulation breakdown as a result of adhesion of the evaporation material Em in the liquid state or solid state that is caused to occur by the bumping inside the recessed part 31*a* of the boat main body 31. Still furthermore, as a result of reflection of radiation heat from the boat main body 31, in case some parts or others such as piping or wiring are disposed in the lower space of the boat main body 31, such parts can advantageously be protected from the heat. As a result, together with the fact of having provided the reinforcing plates 7*a*, 7*b* which serve as the dividing passages, the prolonged lifetime of the evaporation boat 3 can be attained.

In order to confirm the above effects, by using the vacuum evaporation apparatus Es as shown in FIG. 1, the following continuous vacuum evaporation experiments were carried out inside the vacuum chamber 1 under vacuum atmosphere. The experiment conditions were: that the evaporation boat 3 was made of tungsten (W) of 0.3 mm in plate thickness; that the wire-shaped evaporating material Em was made of copper of 2 mm in diameter and was fed at a feeding speed of 10 mm/sec by the material feeding means 6; and that the electric power applied to the evaporation boat 3 was set to 8 KW. In the first experiment, without disposing the supporting means 8, the electrode mounting plate parts 33 and the rising plate parts 32 were provided, as shown in FIG. 1, with a pair of reinforcing plates 7*a*, 7*b* so as to pinch the electrode mounting plate parts 33 and the rising plate parts 32 from both sides in the plate thickness direction. As the reinforcing plates 7*a*, 7*b*, there was selected one made of molybdenum (Mo) of 0.3 mm in plate thickness. First, as a comparative experiment, continuous evaporation was carried out in a state of having no reinforcing plates 7*a*, 7*b*. After a lapse of several minutes from the starting, the rising plate parts 32 were recognized to have been deformed. After a lapse of further time, it was confirmed that the plate thickness of the rising plate parts 32 was decreased, thereby developing into holes. Then, without waiting for 30 minutes after the starting, the rising plate parts 32 were ruptured, resulting in disablement to continue the evaporation. On the other hand, in the first experiment, it was able to continuously carry out evaporation for 90 minutes. Even after continuous evaporation for 90 minutes, it was visually confirmed that the deformation of the evaporation boat 3 (deformation at the rising plate parts 32) was prevented to the best extent possible. Further, the rupture of the rising plate parts 32 was neither confirmed. However, deformation due to creep was found in the bottom plate part 31*b* of the boat main body 31. It was thus clarified that, without using the supporting means 8, the deformation of the bottom plate part 31*b* of the boat main body 31 was found to have been not effectively prevented. Therefore, as a second experiment, a continuous evaporation experiment that was similar to the above in the experiment conditions was carried out by providing both the reinforcing plates 7*a*, 7*b* and the supporting means 8. As a result, continuous evaporation was possible for 90 minutes and, even after the 90 minutes' of continuous evaporation, the deformation of the bottom plate part 31*b* of the evaporation boat 3 was visually confirmed to have been prevented to the best extent possible.

Descriptions have so far been made of the embodiments of this invention but, as long as the technical concept of this invention is not deviated, various modifications are possible. In the above-mentioned embodiments, descriptions have been made based on examples of constituting dividing passages by a pair of reinforcing plates 7*a*, 7*b*. Provided, however, that dividing passages can be arranged to prevent the relative increase in the electric resistance value of the rising plate parts 32 during evaporation, there is no need of limiting to the above-mentioned examples. Instead, electrical conductive parts such as cables or bus bars may be used in connecting in parallel the boat main body 31 with the electrode mounting plate parts 33, thereby forming the dividing passages for the rising plate parts. Further, in the above-mentioned embodiments, descriptions were made based on examples in which the reinforcing plates 7*a*, 7*b* are partly inclined relative to the rising plate parts 32 so that the rising plate parts 32 are pinched by a pair of reinforcing plates 7*a*, 7*b*. But instead of limiting to them, the following arrangement may be employed. For example, after having installed a pair of reinforcing plates 7*a*, 7*b* on each side of the rising plate parts 32 and the electrode mounting plate parts 33 as seen in the thickness direction thereof, the reinforcing plates 7*a*, 7*b* are fastened by means of high-melting point metallic bolts and the like, or else, are integrated by spot welding so that the rising plate parts 32 may be integrated for pinching together.

Further, in the above-mentioned embodiments, regarding the supporting means 8 a description was made of an example in which two pieces of supporting plates 85, 85 bent into the shape of a "⊏" are arranged in parallel with each other. However, it need not be limited to the above as long as the bottom plate part 31*b*, on which is operated the load to be brought by the feeding of the evaporating material Em, can be supported by contact, from the lower side, with the bottom plate part 31*b*. For example, a beam member which is circular in cross section or in an ellipse may be disposed in a manner to bridge the bottom plate part 31*b* so as to support the bottom plate part 31*b*. Or else, a plurality of columnar bodies may be vertically installed on the supporting plates 85 so as to support the bottom plate part 31*b*. By the way, in case the supporting means 8 is provided, this invention may also be applicable to a shape having no rising plate parts 32 as the evaporation port 3. Further, in the above-mentioned embodiments, descriptions were made of examples in which the free ends 85*a*, 85*b* of the supporting plates 85 are installed in parallel in a posture to coincide orthogonally with the longitudinal direction of the boat main body 31. However, this invention is not to be limited thereto but, depending on the direction of vibrations of the wire-shaped evaporation material Em when the evaporation material Em is fed, each of the supporting plates 85, 85 may be installed in a posture in which the width direction of each of the supporting plates 85, 85 coincides with the longitudinal direction of the boat main body 31.

Figure 5A:
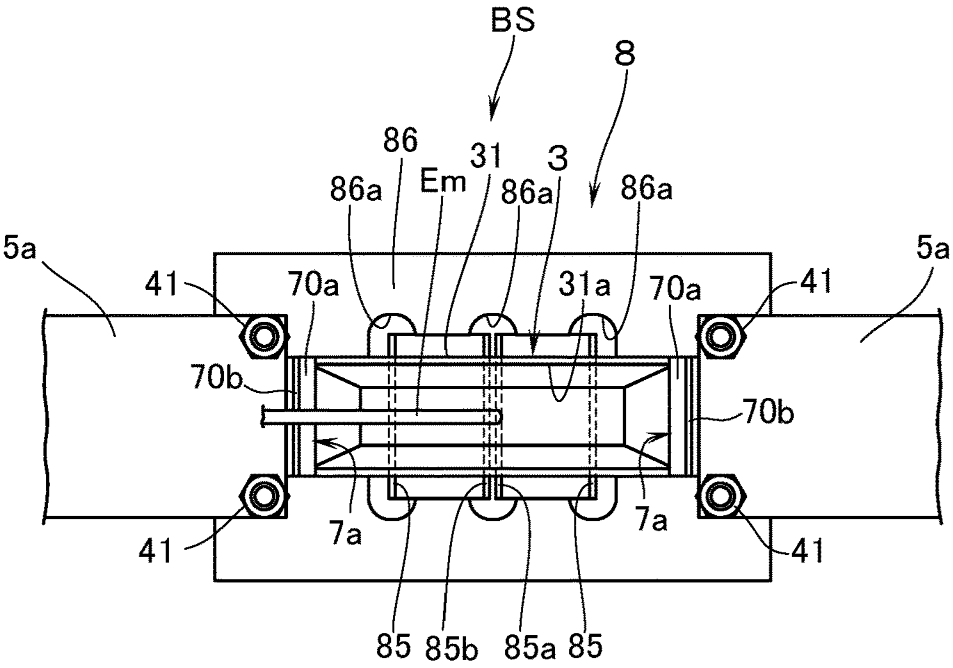
FIG. 5(*a*) and FIG. 5(*b*) are enlarged partial plan view and enlarged partial sectional view of an evaporation source relating to a modified example.
Figure 5B:
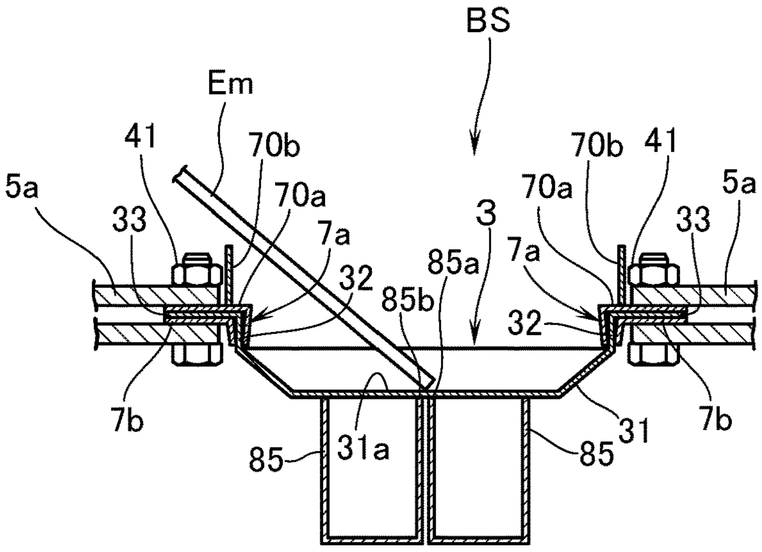

Further, in the above-mentioned embodiments, descriptions were made of examples in which a single piece of plate material was formed into L-shape as the reinforcing plates 7*a*, 7*b*. However, this invention shall not be limited thereto. In a modified example, as shown in FIG. 5(*a*) and FIG. 5(*b*), an upper surface 70*a* of the upper-side reinforcing plates 7*a* is provided with a plate-shaped screen parts 70*b*. The screen parts 70*b* project upward at an inner-side position than such an end face of the electrode plate 5*a* as is on the side of the recessed part 31*a*. In this case, the screen parts 70*b* have widths equivalent to or larger than the reinforcing plates 7*a*. By the way, depending on the condition in which the reinforcing plates 7*a* are mounted, the upper end of the screen parts 70*b* is set so as to become positioned above the upper surface of the electrode plate 5*a*, preferably above the fastening means 41. In this case, the screen parts 70*b* may be formed integrally with the reinforcing plates 7*a* or separate screen parts 70*b* may also be attached, by spot welding and the like, to the reinforcing plates 7*a*. According to this arrangement, even if the molten evaporation material Em may have crawled up to the upper surfaces of the electrode mounting plate parts 33 through the rising plate parts 32 for some reasons or others, the molten evaporation material can be stopped by the screen parts 70*b*. Therefore, direct reaching of the molten evaporation material can surely be prevented by the screen parts 70*b*. By the way, in case the reinforcing plates 7*a*, 7*b* are not used, the electrode mounting plate parts 33 are directly pinched by the pair of upper and lower electrode plates 5*a*, 5*b*, the screen parts 70*b* may be formed on the upper surfaces of the electrode mounting plate parts 33.

Figure 6:
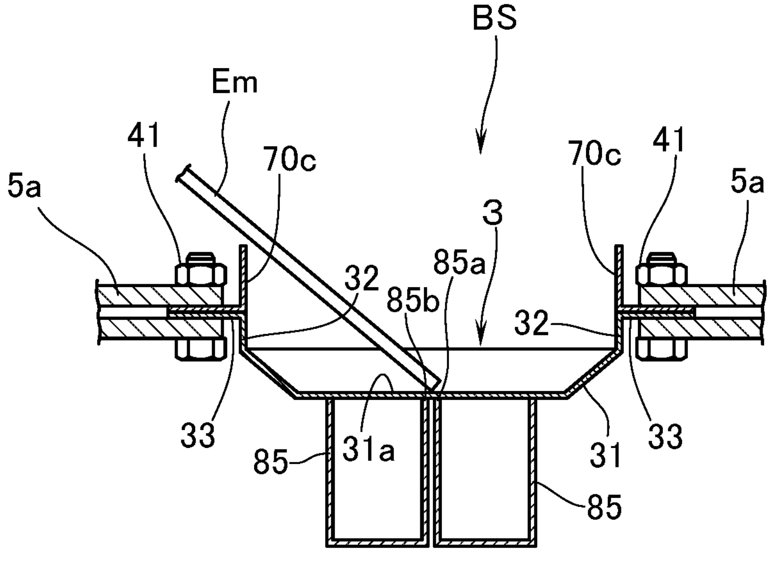
FIG. 6 is an enlarged partial sectional view of an evaporation source relating to another modified example.

In addition, as shown in FIG. 6, the following arrangement may also be employed. Namely, a bent plate 70*c* which is obtained by bending a single piece of plate into L-shape is prepared. After having installed the bent plate 70*c* on the electrode mounting plate parts 33 in a posture in which one free end looks upward, the bent plate 70*c* may be pinched by the pair of upper and lower electrode plates 5*a*, 5*b* together with the electrode mounting plate part 33. According to this arrangement, such a part of the bent plate 70*c* as is elongated upward serves the purpose of a screen part. Therefore, even if the molten evaporation material Em may have crawled up to the upper surface of the electrode mounting plate parts 33 via the rising plate parts 32, the molten evaporation material can be stopped by the screen parts 70*b*. By the way, also in the case of employing the reinforcing plates 7*a*, 7*b*, the bent plate 70*c* may be installed so as to constitute the screen parts.

| EXPLANATION OF MARKS | |
|---|---|
| BS | evaporation source for vacuum evaporation apparatus |
| Em | evaporation material |
| Es | vacuum evaporation apparatus |
| Sg | substrate (article to receive thereon evaporated particles) |
| 1 | vacuum chamber |
| 3 | evaporation boat |
| 31 | boat main body |
| 31a | recessed part (part for containing therein evaporation material) |
| 31b | bottom surface part of the boat main body (part on which is acted the load to be supplied by the supply of evaporating material |
| 32 | rising plate part |
| 33 | electrode mounting plate part |
| 6 | material feeding means |
| 7a, 7b | reinforcing plate (constituting dividing passage) |
| 8 | supporting means |
| 81a, 81b | insulator |
| 82 | first base plate |
| 84 | second base plate (base plate) |
| 85 | supporting plate |
| 86 | reflector plate |

What is claimed is:

1. An evaporation source for use in a vacuum evaporation apparatus which is to deposit an evaporation material on a to-be-deposited article by evaporating the evaporation material in a vacuum chamber, the evaporation source comprising an evaporation boat including: a boat main body having a recessed part for the evaporation material; rising plate parts each rising upward from respective ends as seen in one direction of the boat main body; and electrode mounting plate parts each extending from an upper end of the respective rising plate parts outward, the boat main body being heated by applying electric power across both the electrode mounting plate parts, thereby causing the evaporation material inside the recessed part to be evaporated, wherein the rising plate parts extend upward from the boat main body and are positioned between dividing passages.

2. The evaporation source for use in a vacuum evaporation apparatus according to claim 1, wherein the dividing passages are constituted by a pair of reinforcing plates which are arranged to pinch the electrode mounting plate parts and the rising plate parts from both sides thereof as seen in the plate thickness direction of both the plate parts.

3. The evaporation source for use in a vacuum evaporation apparatus according to claim 2, wherein the reinforcing plates are constituted by a high-melting point metallic material selected from the group consisting of molybdenum, tungsten, and tantalum.

4. The evaporation source for use in a vacuum evaporation apparatus according to claim 3, further comprising a pair of upper and lower electrode plates for pinching therebetween the electrode mounting plate parts, wherein screen parts are disposed each on the reinforcing plate that is positioned on the upper side so as to cover an end face, lying on the side of the boat main body, of the electrode plate.

5. The evaporation source for use in a vacuum evaporation apparatus according to claim 2, further comprising a pair of upper and lower electrode plates for pinching therebetween the electrode mounting plate parts, wherein screen parts are disposed each on the reinforcing plate that is positioned on the upper side so as to cover an end face, lying on the side of the boat main body, of the electrode plate.

6. The evaporation source for use in a vacuum evaporation apparatus according to claim 2, wherein the dividing passages are shaped to conform to outlines of the rising plate parts and the electrode mounting plate parts.

7. The evaporation source for use in a vacuum evaporation apparatus according to claim 2, wherein a first reinforcing plate of the pair of reinforcing plates, attached from above to the rising plate parts and the electrode mounting plate parts, has a downwardly bent part inclined toward the rising plate parts relative to an extension line passing through the rising plate parts within a predetermined angle range, and wherein a second reinforcing plate of the pair of reinforcing plates, attached from below to the rising plate parts and the electrode mounting plate parts, has a downwardly bent part inclined toward the rising plate parts relative to the extension line within the predetermined angle range.

8. The evaporation source for use in a vacuum evaporation apparatus according to claim 2, wherein the dividing passages are configured such that an applied electric current is divided at the rising plate parts when molten evaporation material is formed in the boat main body, thereby reducing a relative increase in electrical resistance at the rising plate parts.

9. The evaporation source for use in a vacuum evaporation apparatus according to claim 2, wherein the dividing passages are configured such that an applied electric current flowing through the rising plate parts is divided when molten evaporation material is formed in the boat main body, thereby reducing a relative increase in electrical resistance at the rising plate parts.

10. The evaporation source for use in a vacuum evaporation apparatus according to claim 2, wherein each of the reinforcing plates is formed by fabricating a single plate material into an L-shape.

* * * * *